United States Patent
Mosley et al.

(10) Patent No.: US 8,029,904 B2
(45) Date of Patent: Oct. 4, 2011

(54) ARYL (THIO)ETHER ARYL POLYSILOXANE COMPOSITION AND METHODS FOR MAKING AND USING SAME

(75) Inventors: David Wayne Mosley, Philadelphia, PA (US); Garo Khanarian, Princeton, NJ (US)

(73) Assignee: Rohm and Haas Company, Philadelphia, PA (US)

( * ) Notice: Subject to any disclaimer, the term of this patent is extended or adjusted under 35 U.S.C. 154(b) by 212 days.

(21) Appl. No.: 11/983,253

(22) Filed: Nov. 8, 2007

(65) Prior Publication Data

US 2008/0160323 A1    Jul. 3, 2008

Related U.S. Application Data

(60) Provisional application No. 60/872,094, filed on Dec. 1, 2006.

(51) Int. Cl.
*C08G 77/20* (2006.01)
*C08K 3/10* (2006.01)
*B05D 5/12* (2006.01)
*B32B 27/00* (2006.01)

(52) U.S. Cl. ............... 428/447; 427/77; 528/15; 528/32

(58) Field of Classification Search .................. None
See application file for complete search history.

(56) References Cited

U.S. PATENT DOCUMENTS

| | | | | |
|---|---|---|---|---|
| 3,013,044 A * | 12/1961 | Schnabel | | 556/447 |
| 3,114,759 A * | 12/1963 | Lewis | | 556/447 |
| 3,125,635 A * | 3/1964 | Murray | | 348/775 |
| 3,270,133 A * | 8/1966 | Holub | | 348/775 |
| 3,296,196 A * | 1/1967 | Lamoreaux | | 528/26 |
| 3,385,878 A * | 5/1968 | Wu | | 556/447 |
| 3,452,072 A * | 6/1969 | Sporck | | 525/477 |
| 3,642,596 A | 2/1972 | Takamizawa et al. | | |
| 3,767,691 A * | 10/1973 | Clark | | 556/427 |
| 3,770,790 A * | 11/1973 | Clark | | 556/447 |
| 3,801,535 A * | 4/1974 | Joschko | | 524/731 |
| 4,501,688 A * | 2/1985 | Braus | | 252/573 |
| 4,714,734 A * | 12/1987 | Hashimoto et al. | | 524/496 |
| 2002/0000457 A1 | 1/2002 | Biebuyck et al. | | |
| 2006/0052623 A1 * | 3/2006 | Yoshida et al. | | 556/450 |
| 2006/0116499 A1 * | 6/2006 | Ootake et al. | | 528/9 |
| 2007/0273051 A1 * | 11/2007 | Kato et al. | | 257/791 |
| 2008/0090986 A1 | 4/2008 | Khanarian et al. | | |

FOREIGN PATENT DOCUMENTS

EP    0 398 573        11/1990
SU    427943           5/1974
WO    WO 2004081084 A1 *  9/2004

OTHER PUBLICATIONS

Data sheet for Aluminum oxide, http://www.matweb.com/search/DataSheet.aspx?bassnum=BA1A&ckck=1, 5 pages, 2010.*
Walter Fink; "26. Silylated Polyphenyl Ethers: Their preparation and some physical properties"; Helvetica Chimica Acta—vol. 56(1), No. 25-26; 1973; pp. 355-363 (with translation).
Gilman et al.; "Some Organosilicon Compounds Containing Long-Chained n-Alkyl Groups"; J. Org. Chem; 1959; pp. 219-224.
Gilman et al.; "Selective Reactions of the Silicon-Hydrogen Group with Grignard Reagents. The Preparation of Some Unsymmetrical Silane Derivatives"; J. Amer. Chem. Soc.; 81; 1959; pp. 5925-5928.
Gilman et al.; "Some Monomeric Organosilicon Compounds of High Thermal Stability"; J. Org. Chem.; pp. 45-47.
Gilman et al.; "Some Organosilicon Compounds Derived from Phenyl Ether"; J. Org. Chem.; 1958; pp. 1363-1365.
Sobolev et al.; "Synthesis of Organosilicon Monomers Containing Groups With an Ether Link"; Zhurnal Obshchei Khimii; 39(12); 1969; pp. 2629-2632.
Baney et al..; "Silsesquioxanes"; *Chem Review*; (1995), 95, pp. 1409-1430.
European Search Report of corresponding European Application No.: 07 12 1240 mailed Apr. 1, 2008.

* cited by examiner

*Primary Examiner* — Randy Gulakowski
*Assistant Examiner* — Robert Loewe
(74) *Attorney, Agent, or Firm* — Jonathan D. Baskin

(57) ABSTRACT

A curable aryl (thio)ether aryl silicon composition is disclosed. A cured aryl (thio)ether aryl polysiloxane composition is further disclosed, along with a method of making that cured aryl (thio)ether aryl polysiloxane composition from the curable aryl (thio)ether aryl silicon composition. An encapsulated semiconductor device, and a method of making that encapsulated semiconductor device by coating a semiconductor element of a semiconductor device with cured aryl (thio)ether aryl polysiloxane are further disclosed.

10 Claims, No Drawings

ARYL (THIO)ETHER ARYL POLYSILOXANE COMPOSITION AND METHODS FOR MAKING AND USING SAME

This application claims the benefit of priority under 35 U.S.C. §119(e) of U.S. Provisional Patent Application No. 60/872,094, filed on Dec. 1, 2006, the disclosure of which is incorporated herein by reference.

The present invention relates to a curable aryl (thio)ether aryl silicon composition, to a method of making a cured aryl (thio)ether aryl polysiloxane composition therefrom, and to that cured aryl (thio)ether aryl polysiloxane composition, as well as to an encapsulated semiconductor device, and a method of making that encapsulated semiconductor device by coating a semiconductor element of a semiconductor device with the cured aryl (thio)ether aryl polysiloxane composition.

There is a need for transparent high refractive index silicones for optical applications. There is also a need for thermally stable silicones. In addition, there is need for polysiloxanes and other silicon-based polymers having high refractive index, good thermal stability, and transparency which are liquid, or which form curable compositions which are liquid before curing, during some portion of curing, or both. In many cases, silicones are needed which can be cured into elastomers. In these cases it is convenient to have liquid silicone-based precursors which can be cross-linked to form cured compositions.

High refractive index polymers are of interest for optical device encapsulation, medical optical devices such as contacts or intraocular lenses, and plastic optical components such as lenses and waveguides. In many of these cases it is desirable to cure the polymer in place using liquid silicon-containing reactants, and to use silicon-containing reactants that are high refractive index polymers, such as polysiloxanes.

High brightness LED manufacturers desire optical polymers with high transparency in the visible region, high refractive indexes (indexes higher than 1.6), and excellent heat stability over tens of thousands of hours of operation. Additionally the LED industry uses liquid prepolymers, which are then cured in place after much of the device is assembled. Therefore the curing polymer system must show minimal shrinkage, and must be curable under conditions which do not harm the assembled device. At this time, manufacturers employ epoxies and silicones for this purpose. However, epoxies exhibit too much yellowing for use in the new high power LED devices, which can operate at junction temperatures of 150° C. Silicones are therefore becoming the dominant encapsulant in LEDs, since some silicones exhibit excellent heat stability and little yellowing. Commercial silicone encapsulants currently have refractive indexes ranging from 1.41 to 1.57. The refractive index of the encapsulant plays an important role in determining how much light is extracted from the LED device. This is due to total internal reflection of light as it passes from the solid-state high refractive index LED to a low index polymer medium. Typical LED devices have refractive indexes of 2.5. Thus, there is great interest in obtaining silicone encapsulants having higher refractive indices.

The refractive index of a polymer is determined by the molar refractivities of its constituent groups. Commercial silicone monomers are predominantly combinations of aliphatic groups and phenyl groups. This effectively limits the refractive index in traditional liquid silicones to an upper end of about 1.57-1.58. The refractive index of poly(diphenylsiloxane) is 1.61, but it is a solid polymer. Since many applications require liquid prepolymers, it is necessary to blend lower glass transition temperature ($T_g$) monomers with diphenylsiloxane monomers in order to obtain a liquid, leading to a reduction in the refractive index. This leads to an upper end RI of 1.57-1.58, as mentioned. What is needed is a monomer that has a similar or higher refractive index and a lower $T_g$ than diphenylsiloxane monomers.

U.S. Pat. No. 3,114,759 discloses polysiloxane compositions having a terminal p-phenoxyphenylphenylmethylsilane group, wherein the capping is introduced in order to increase heat stability. U.S. Pat. No. 3,385,878 discloses cyclosiloxanes having 3 and 4 monomer units. These cyclosiloxanes contain one or two di(p-phenoxyphenyl)silyl units combined with diphenylsilyl units.

We have surprisingly discovered that curable aryl (thio)ether aryl silicon compositions may be cured to form cured aryl (thio)ether aryl polysiloxane compositions useful as encapsulants for light emitting devices. Silicon-based precursors which include silicon bonded aryl (thio)ether aryl groups have very desirable properties, and are useful as components of the curable aryl (thio)ether aryl silicon compositions. For example, p-phenoxyphenylphenylsilyl compounds can be polymerized to make a liquid polymer composition. Liquid poly(p-phenoxyphenyl)phenylsiloxanes can be produced with a refractive index of 1.605 to 1.62. This is an improvement over the traditional high RI diphenylsilyl monomers, which produce a solid homopolymer even at low degrees of polymerization (i.e., as low as 5 or 6 polymer units).

One aspect of the present invention is directed to a cured aryl (thio)ether aryl polysiloxane composition including an aryl (thio)ether aryl polysiloxane represented by the average compositional Formula I,

$$(R^1{}_n SiO_{(4-n)/2})_a (O_{(4-p-r)/2} R^2{}_p SiZ_r SiR^3{}_q O_{(4-q-r)/2})_b \quad (I),$$

wherein:
for each ($R^1{}_n SiO_{(4-n)/2}$) unit:
   subscript n equals independently 0, 1, 2, or 3;
for each ($O_{(4-p-r)/2} R^2{}_p SiZ_r SiR^3{}_q O_{(4-q-r)/2}$) unit:
   subscript p equals 0, 1, 2, or 3;
   subscript q equals 0, 1, 2 or 3;
   p+q=0 to [8−(2r+1)];
   subscript r=1, 2, or 3;
   Z is selected from —$CHR^4CHR^5$—$X_s$—, arylene, substituted arylene, and combinations thereof, wherein:
     —$CHR^4CHR^5$—$X_g$— is the silicon-bridging alkylene moiety
     X is independently selected from methylene, phenyl, substituted phenyl, oxygen, and combinations thereof;
     subscript s=0 or 1; and
     $R^4$ and $R^5$ are independently selected from hydrogen atom, aryl (thio)ether, aryl, and alkyl;
$R^1$, $R^2$, and $R^3$ include a silicon-bonded organic group selected from alkenyl, hydrogen atom, aryl, alkyl, hydroxy, alkoxy, aryloxy, aryl (thio)ether aryl, other hydrocarbon radical, and combinations thereof;
at least one of $R^1$, $R^2$, and $R^3$ includes a silicon bonded aryl (thio)ether aryl group;
subscripts a and b are selected to conform with the mole fraction of the ($R^1{}_n SiO_{(4-n)/2}$) unit and the ($O_{(4-p-r)/2} R^2{}_p SiZ_r SiR^3{}_q O_{(4-q-r)/2}$) unit, respectively;
$0 \leq a \leq 1$; $0 \leq b \leq 1$; and
a+b=1.

A second aspect of the present invention is directed to a method of making the cured aryl (thio)ether aryl polysiloxane composition of the first aspect of the present invention, including the steps of:

A. providing a curable aryl (thio)ether aryl silicon composition including a silicon-based precursor, wherein:
  at least one silicon-based precursor includes a silicon bonded aryl (thio)ether aryl group; and
  at least one silicon-based precursor is a multi-linkable precursor including two or more reactive groups capable of reacting with a complementary reactive group of the same or other multi-linkable precursor; and
B. curing the curable aryl (thio)ether aryl silicon composition to form the cured aryl (thio)ether aryl polysiloxane composition.

A third aspect of the present invention is directed to a curable aryl (thio)ether aryl silicon composition including: a silicon-based precursor, wherein:
  at least one silicon-based precursors includes a silicon bonded aryl (thio)ether aryl group; and
  at least one silicon-based precursor includes a multi-linkable precursor including two or more reactive groups capable of reacting with a complementary reactive group of the same or other multi-linkable precursor.

A fourth aspect of the present invention is directed to an encapsulated semiconductor device, including semiconductor elements, wherein one or more of the semiconductor elements is coated with the cured aryl (thio)ether aryl polysiloxane composition of the first aspect of the present invention.

The terminology of this specification includes words specifically mentioned herein, derivatives thereof, and words of similar import.

Used herein, the following terms have these definitions:

The words "a" and "an" as used in the specification mean "at least one", unless otherwise specifically stated.

"Range". Disclosures of ranges herein take the form of lower and upper limits. There may be one or more lower limits and, independently, one or more upper limits. A given range is defined by selecting one lower limit and one upper limit. The selected lower and upper limits then define the boundaries of that particular range. All ranges that can be defined in this way are inclusive and combinable, meaning that any lower limit may be combined with any upper limit to delineate a range.

A "silicon bonded organic group" is an organic group bonded to a silicon atom, wherein an "organic group" contains at least one carbon, or is a hydrogen atom or hydroxy group.

A "silicon bonded aryl group" ("silicon bonded aryl") is an aryl group having a carbon of an aromatic ring directly bonded to a silicon atom. Other suitable silicon bonded organic groups include, for example: "silicon bonded aryl (thio)ether aryl group" ("silicon bonded aryl (thio)ether aryl"); "silicon bonded alkenyl group" ("silicon bonded alkenyl"); "silicon bonded hydrogen atom" ("silicon bonded hydrogen"); "silicon bonded alkyl group" ("silicon bonded alkyl"); "silicon bonded alkoxy group" ("silicon bonded alkoxy"); "silicon bonded aralkoxy group" ("silicon bonded aralkoxy"); "silicon bonded hydroxy group" ("silicon bonded hydroxy"); "silicon bonded (meth)acryloxy group" ("silicon bonded (meth)acryloxy"); "silicon bonded acetoxy group" ("silicon bonded acetoxy"); and combinations thereof.

A "silicon bonded phenoxy phenyl group" is a silicon bonded aryl group having a carbon atom of a phenyl ring directly bonded to a silicon atom and another carbon of the same phenyl ring directly bonded to an oxygen atom of a "phenoxy substituent". That oxygen atom is therefore an "ether linkage" of the silicon bonded phenoxy phenyl group.

A "silicon bonded phenylthio phenyl group" is a silicon bonded aryl group having a carbon atom of a phenyl ring directly bonded to a silicon atom and another carbon of the same phenyl ring directly bonded to a sulfur atom of a "phenylthio substituent". That sulfur atom is therefore a "thioether linkage" of the silicon bonded phenylthio phenyl group.

A "silicon bonded phenyl (thio)ether phenyl group" is selected from silicon bonded phenoxy phenyl group, silicon bonded phenylthio phenyl group, and combinations thereof. The term "(thio)ether" refers to both an "ether" having an oxygen atom as a linkage between two phenyl rings, and a "thioether" having a sulfur atom as a linkage between two phenyl rings.

A "silicon bonded aryloxy aryl group" is a silicon bonded aryl group having a carbon atom of an aryl ring directly bonded to a silicon atom and another carbon of the same aryl ring directly bonded to an oxygen atom of an "aryloxy substituent". That oxygen atom is therefore an "ether linkage" of the silicon bonded aryloxy aryl group.

A "silicon bonded arylthio aryl group" is a silicon bonded aryl group having a carbon atom of an aryl ring directly bonded to a silicon atom and another carbon of the same aryl ring directly bonded to a sulfur atom of an "arylthio substituent". That sulfur atom is therefore a "thioether linkage" of the silicon bonded arylthio aryl group.

A silicon bonded "aryl (thio)ether aryl group" is selected from silicon bonded aryloxy aryl group, silicon bonded arylthio aryl group, and combinations thereof.

The terms "mole percent" and "mol %" are used interchangeably throughout. The "mol % of silicon bonded aryl (thio)ether aryl groups" for a given silicon compound, for example a siloxane or a silane, is the number of moles of silicon bonded aryl (thio)ether aryl groups contained in that silicon compound, divided by the number of moles of all silicon bonded organic groups. For example, a hydrido silicon-based precursor having 8 silicon bonded aryl (thio)ether aryl groups and 2 silicon bonded hydrogen atoms, for a total of 10 silicon bonded organic groups, contains 80 mol % silicon bonded aryl (thio)ether aryl groups, based on total silicon bonded organic groups of the hydrido silicon compound.

A "silicon bonded alkenyl group" ("silicon bonded alkenyl") is a silicon bonded hydrocarbon radical bearing an ethylenically unsaturated group. Examples of silicon bonded alkenyl groups include: vinyl; allylic groups (i.e., groups in which a carbon-carbon double bond is immediately adjacent to a —$CH_2$— group or a —CHR— group).

An "alkenyl silicon-based precursor" is a silicon-based compound including a silicon bonded alkenyl group.

An "alkenyl aryl (thio)ether aryl silicon compound") includes a silicon bonded alkenyl group and a silicon bonded aryl (thio)ether aryl group.

A "multi-linkable precursor" is a precursor compound including two or more reactive groups capable of reacting with a "complementary reactive group" of another precursor. A "complementary reactive group" is a reactive group capable of reacting with another reactive group (i.e., another complementary reactive group able to react with the first complementary reactive group) to form a covalent bond linking precursor components during curing of a curable aryl (thio)ether aryl silicon composition. The reactive groups of a multi-linkable precursor may be the same or different. For example, one multi-linkable precursor might include two identical or different silicon bonded alkenyl groups, while another multi-linkable precursor of the same curable aryl (thio)ether aryl silicon composition might include three silicon bonded hydrogen atoms. In the presence of a hydrosilation catalyst, these two precursors can be incorporated into a "crosslinked polysiloxane network" by hydrosilation. In an alternative example, one multi-linkable precursor includes one silicon bonded alkenyl group and one silicon bonded methoxy group, while another precursor includes one silicon bonded hydrogen atom and one silicon bonded methoxy group. In this alternative example, crosslinking can be achieved by a combination of reacting a silicon bonded alkenyl group with a silicon bonded hydrogen atom in the presence of a hydrosilation catalyst to form a silicon-bridging alkylene moiety, and moisture induced reaction of methoxy groups to form an Si—O—Si linkage. One of skill in the art will recognize that all or a portion of the reactive groups of a multi-linkable precursor may actually react with complementary reactive groups of another, or same, multi-linkable precursor. The degree to which reaction of all groups occurs will be dependent upon such factors as relative amounts of complementary reactive groups, details of curing conditions, and accessibility of reactive groups as molecular weight and degree of crosslinking increase for the aryl (thio)ether aryl siloxane during curing.

A "mono-linkable precursor" is a precursor compound including one reactive group capable of reacting with a "complementary reactive group" of another precursor. The "capping agent" of the present invention is a mono-linkable precursor.

A "hydrido silicon compound" is a silicon-based precursor including a silicon bonded hydrogen atom.

The term "primary siloxane unit" refers to a portion of a polysiloxane containing a single silicon atom, wherein that silicon atom is directly bonded to between one and four oxygen atoms, and each of those oxygen atoms is, in turn bonded to another silicon atom of an adjacent primary siloxane unit. For example, $(CH_3)_3Si—O—Si(CH_3)_3$ is a polysiloxane having two primary siloxane units. Each primary siloxane unit has a single silicon atom bonded to three methyl groups and one oxygen atom, such that the oxygen atom is bound to both silicon atoms. Each of the two primary siloxane units of $(CH_3)_3Si—O—Si(CH_3)_3$ are defined infra as an "M-unit". In a second example, $(CH_3)_3Si—O—Si(CH_3)_2OH$ is also a polysiloxane having two primary siloxane units, each of which has a single silicon atom bonded to the same single oxygen atom wherein that oxygen atom is bonded to a second silicon atom. The oxygen of the hydroxy group is not bonded to a second silicon atom and, as such, is not counted as a second oxygen atom for the purpose of determining if the primary siloxane unit to which it belongs is an M-unit or a D-unit. Therefore, the hydroxy group is treated as a silicon bonded organic group and the primary siloxane unit to which it belongs is an M-unit.

A "polysiloxane" is a siloxane having at least two primary siloxane units.

The term "M-unit" refers to a primary siloxane unit of a polysiloxane, wherein the silicon of that unit is attached to single, immediately adjacent, —O—Si— moiety through a covalent bond to the oxygen atom of that —O—Si— moiety.

Similarly, the terms "D-unit", "T-unit", and "Q-unit" refer, respectively, to a primary siloxane unit of a siloxane, wherein the silicon of that unit is attached to two, three, or four immediately adjacent —O—Si— moieties through a covalent bond to the oxygen atom of each of those —O—Si— moieties.

The term "ppm" means "parts per million" which, in turn, means "weight parts per million weight parts". Parts per million are weight based. Therefore, the amount of a given component x in a composition y is calculated by dividing the weight of component x by the weight of composition y and then multiplying by one million. For example, if 0.002 gram of platinum metal is present in 1000 grams of a cured aryl (thio)ether aryl polysiloxane composition, the Pt metal is present at 2 ppm, based on the total weight of that cured aryl (thio)ether aryl polysiloxane composition.

A "curable aryl (thio)ether aryl silicon composition" includes a "silicon-based precursor component" ("silicon-based precursor"). Although it is not necessary that every silicon-based precursor of the curable aryl (thio)ether aryl silicon composition have a silicon bonded aryl (thio)ether aryl group, at least one "silicon-based precursor component" of a curable aryl (thio)ether aryl silicon composition must contain a silicon bonded aryl (thio)ether aryl group. A silicon-based precursor may be a multi-linkable precursor or a mono-linkable precursor. The curable aryl (thio)ether aryl silicon composition must include at least one multi-linkable precursor, and may optionally include a mono-linkable precursor (see capping agents infra). While the curable aryl (thio)ether aryl silicon composition of the present invention must include a silicon-based precursor component, the composition may also, optionally, include a "non-silicon precursor component" ("non-silicon precursor", see capping agents infra).

The "cured aryl (thio)ether aryl polysiloxane composition" of the present invention, containing a "cured aryl (thio)ether aryl polysiloxane", may be formed from the curable aryl (thio)ether aryl silicon composition by a variety of curing methods well known in the art. Therefore, one or more of the silicon bonded groups of a given silicon-based precursor component will reflect the method by which all or a portion of that silicon precursor component will become incorporated into the cured aryl (thio)ether aryl polysiloxane. For example, the method of hydrosilation requires that a silicon precursor component contain a silicon bonded alkenyl group and that a silicon precursor component contain a silicon bonded hydrogen atom. In such case, the silicon bonded alkenyl group and the silicon bonded hydrogen atom may be attached to the same or different silicon precursor components. Similarly, when the curing method is moisture curing, silicon bonded methoxy (or other alkoxy), acetoxy, hydroxy, and combinations thereof are illustrative functional groups. Silicon bonded alkenyl, methyl, and combinations thereof are illustrative functional groups useful when the curing method is a free radical curing method. Silicon bonded (meth)acrylate groups are useful for ultraviolet curing methods, and silicon bonded epoxy-containing groups are useful for epoxidation based curing methods.

When the curing method is hydrosilation, the curable aryl (thio)ether aryl silicon composition may include: a silicon-based precursor having at least two silicon bonded alkenyl groups; a silicon-based precursor having at least two silicon bonded hydrogen atoms; and a hydrosilation catalyst present in an amount sufficient to effect curing by hydrosilation. Alternatively, a silicon-based precursor component may be an alkenyl hydrido silicon-based precursor including both a silicon bonded alkenyl group and a silicon bonded hydrogen atom. The curable aryl (thio)ether aryl silicon composition useful for hydrosilation, therefore, includes a hydrosilation catalyst and: an alkenyl silicon-based precursor and a hydrido silicon-based precursor; an alkenyl hydrido silicon-based precursor; or an alkenyl hydrido silicon-based precursor and an alkenyl silicon-based precursor or a hydrido silicon-based precursor, or both.

A "hydrosilation catalyst" includes a Group VIII element selected from platinum, rhodium, palladium, ruthenium, iridium, or combinations thereof, and is capable of catalyzing the addition of an Si—H group across the double bond of an ethylenically unsaturated group. One of skill in the art will recognize that, for a hydrosilation catalyst to be effective, it is important that none of the precursor components acts to significantly degrade the performance of that hydrosilation catalyst. When a system contemplated for use as a curable aryl (thio)ether aryl silicon composition is found to significantly inhibit hydrosilation, that system will typically be modified by removal of the inhibiting group or by modifying precursor components with complementary reactive groups capable of achieving crosslinking by means other than hydrosilation.

A "high RI nanoparticle" is a particle having a refractive index ("RI") of at least 1.8 to no more than 3.5. Plural high RI nanoparticles have an "average particle diameter" of at least 1 nm and no more 30 nm.

A "Group VIII element equivalent value" expresses the amount of a hydrosilation catalyst present in a curable aryl (thio)ether aryl silicon composition or cured aryl (thio)ether aryl polysiloxane composition, in terms of the amount of Group VIII element present in that composition. If, for example, a given hydrosilation catalyst, itself containing 50 weight percent of a Group VIII element, is present in a curable aryl (thio)ether aryl silicon composition in an amount of 10 ppm, then the amount of hydrosilation catalyst present in that composition, "expressed as a Group VIII element equivalent value", is 5 ppm.

A suitable "silicon-bridging alkylene moiety" is "—$CHR^4$—$CHR^5$—$X_s$—, wherein at least one of the two carbons derived from the carbon-carbon unsaturated bond of an alkenyl silicon-based precursor by hydrosilation (i.e., the carbon to which $R^4$ is bound) is covalently bound to a silicon atom of the alkylene bridged aryl (thio)ether aryl polysiloxane. The other carbon (i.e., the carbon to which $R^5$ is bound) may be bound directly to another silicon (subscript s=0) or bound to another silicon through X (subscript s=1), wherein X is selected from methylene, phenyl, substituted phenyl, and oxygen. In this way, a larger "Si—$CHR^4$—$CHR^5$—$X_s$—Si moiety" is formed. The alkylene bridged polysiloxane (i.e., "alkylene bridged aryl (thio)ether aryl polysiloxane") of the present invention must include at least one silicon-bridging alkylene moiety. However, it is not a requirement that the cured aryl (thio)ether aryl polysiloxane of the present invention include a silicon-bridging alkylene moiety. Silicon-bridging alkylene moieties will typically be present in the cured aryl (thio)ether aryl polysiloxane when hydrosilation is utilized as a method of achieving curing. If, on the other hand, moisture induced curing is the sole method of curing, then silicon-bridging alkylene moieties would not be formed during curing.

An "alkylene bridged aryl (thio)ether aryl polysiloxane" may, optionally, be a component of a cured aryl (thio)ether aryl polysiloxane composition. An "alkylene bridged aryl (thio)ether aryl polysiloxane" is an aryl (thio)ether aryl polysiloxane including: a silicon-bridging alkylene moiety; at least one unit derived from an "alkenyl silicon-based precursor" and at least one unit derived from a "hydrido silicon-based precursor", or, alternatively, at least one unit derived from an "alkenyl hydrido silicon-based precursor"; and at least one aryl (thio)ether aryl group. A cured aryl (thio)ether aryl polysiloxane may, optionally, include a "reactive silicon bonded organic group" including silicon bonded alkenyl, silicon bonded hydrogen atom, silicon bonded alkoxy, silicon bonded aralkoxy, silicon bonded hydroxy, silicon bonded acetoxy, silicon bonded (meth)acyloxy, silicon bonded epoxy, and combinations thereof. Alternatively, an aryl (thio)ether aryl polysiloxane may include no reactive silicon bonded organic groups.

A "capping agent" includes a single "capping moiety" capable of reacting with a reactive silicon bonded organic group of a silicon-based precursor. Typically, a capping agent is a mono-linkable precursor. When it is desired to reduce the number of such reactive silicon bonded organic groups of a contemplated cured aryl (thio)ether aryl polysiloxane (e.g., an alkylene bridged aryl (thio)ether aryl polysiloxane), a capping agent is added to the corresponding "curable aryl (thio) ether aryl silicon composition" from which that contemplated cured aryl (thio)ether aryl polysiloxane is to be made. Typically, the capping agent is added to the curable aryl (thio)ether aryl silicon composition before curing. Alternatively, the capping agent may be added during curing, or after curing, or portions of the capping agent may be added at various points before, during, and after the curing step. One of skill in the art will recognize that the feasibility of adding a "capping agent" after curing has begun will depend upon such factors as degree of crosslinking of the growing or fully formed network of the curing aryl (thio)ether aryl polysiloxane, and the solubility and mobility of the capping agent within that network during and after curing, all of which influence the ability of the capping agent to diffuse so that capping will be uniform. The term "capped" means that a reactive silicon bonded organic group of a cured, or curing, aryl (thio)ether aryl polysiloxane composition has been reacted with a capping agent capable of reacting with that reactive group. The "capping reaction" typically creates a new unreactive, or less reactive, (i.e., "capped") end group. One of skill in the art will understand that, depending upon the specific characteristics of the precursor components including the capping agent, other reacting species, the relative amounts of each, and other details of the "capping reaction" (e.g., time, temperature, and mixing), all, or fewer than all, of the reactive silicon bonded organic groups may be "capped". A capping agent may be selected from silicon-based precursor, non-silicon precursor, and combinations thereof.

When a "cured aryl (thio)ether aryl polysiloxane composition" has been formed using hydrosilation, that cured aryl (thio)ether aryl polysiloxane includes: an alkylene bridged aryl (thio)ether aryl polysiloxane; and a hydrosilation catalyst. If it is desired that the hydrosilation catalyst containing cured aryl (thio)ether aryl polysiloxane composition not discolor, as determined by the accelerated heat aging test of the present invention, then the hydrosilation catalyst should typically be present in an amount of at least 0.005 ppm to no more than 3.0 ppm, expressed as a Group VIII element equivalent value, based on the weight of the cured aryl (thio)ether aryl polysiloxane composition.

Uses for the cured aryl (thio)ether aryl polysiloxane composition of the present invention include use as an encapsulant for high brightness light emitting devices (HBLEDs). In such case, the cured aryl (thio)ether aryl polysiloxane must be stable for extended times (thousands of hours) at use temperatures of 100° C. to 130° C., or even higher, in air. A test of the capability of a cured aryl (thio)ether aryl polysiloxane to perform without loss of properties is the "accelerated heat aging test" of the present invention. A cured aryl (thio)ether aryl polysiloxane composition that passes the accelerated heat aging test does not discolor during 14 days of heat aging at 200° C. in air, as indicated by a CIE b value, determined using CIE 1976 L*a*b* $D_{65}$(illumination angle)/10(observation angle) color test method, of no more than 2.0 measured through a 0.6 millimeter thick specimen of the cured aryl (thio)ether aryl polysiloxane composition after the heat aging.

The "average particle size" determined for a collection of particles (i.e., plural particles) is the "weight average particle size", "$d_w$", as measured by Capillary Hydrodynamic Fractionation technique using a Matec CHDF 2000 particle size analyzer equipped with a HPLC type Ultra-violet detector. The terms "particle size", "particle diameter", and "PS" are used interchangeably herein. The terms "average particle size", "average particle diameter", "weight average particle size", "weight average particle diameter" and "$d_w$" are used interchangeably herein. The term "particle size distribution" and the acronym "PSD" are used interchangeably herein. "Polydispersity" is used in the art as a measure of the breadth of a distribution of values, in this case measured size values for a collection of particles. Used herein, "PSD polydispersity" is a description of the distribution of particle sizes for a plurality of particles. PSD polydispersity is calculated from the weight average particle size, $d_w$, and the number average particle size, $d_n$, according to the formulae:

$$\text{PSD Polydispersity} = (d_w)/(d_n),$$

where $d_n = \Sigma n_i d_i / \Sigma n_i$
$d_w = \Sigma n_i d_i d_i / \Sigma n_i d_i$, and where $n_i$ is the number of particles having the particle size $d_i$.

Synthetic polymers are almost always a mixture of chains varying in molecular weight, i.e., there is a "molecular weight distribution", abbreviated "MWD". For a homopolymer, members of the distribution differ in the number of monomer units which they contain. This way of describing a distribution of polymer chains also extends to copolymers. Given that there is a distribution of molecular weights, the most complete characterization of the molecular weight of a given sample is the determination of the entire molecular weight distribution. This characterization is obtained by separating the members of the distribution and then quantifying the amount of each that is present. Once this distribution is in hand, there are several summary statistics, or moments, which can be generated from it to characterize the molecular weight of the polymer.

The two most common moments of the distribution are the "weight average molecular weight", "$M_w$", and the "number average molecular weight", "$M_n$". These are defined as follows:

$$M_w = \Sigma(W_i M_i)/\Sigma W_i = \Sigma(N_i M_i^2)/\Sigma N_i M_i$$

$$M_n = \Sigma W_i / \Sigma (W_i / M_i) = (N_i M_i)/\Sigma N_i$$

wherein:
$M_i$=molar mass of $i^{th}$ component of distribution
$W_i$=weight of $i^{th}$ component of distribution
$N_i$=number of chains of $i^{th}$ component,
and the summations are over all the components in the distribution. $M_w$ and $M_n$ are typically computed from the MWD as measured by Gel Permeation Chromatography (see the Experimental Section). The "MWD polydispersity" is equal to $M_w/M_n$.

Estimation of whether a polymer and another component (e.g., another polymer, or a solvent or other small molecule) will be miscible may be made according to the well-known methods delineated in D. W. Van Krevelen, Properties of Polymers, $3^{rd}$ Edition, Elsevier, pp. 189-225, 1990. For example, Van Krevelen defines the total solubility parameter ($\delta t$) for a substance by:

$$\delta_t^2 = \delta_d^2 + \delta_p^2 + \delta_h^2,$$

wherein $\delta_d$, $\delta_p$, and $\delta_h$ are the dispersive, polar, and hydrogen bonding components of the solubility parameter, respectively. Values for $\delta_d$, $\delta_p$, and $\delta_h$ have been determined for many solvents, polymers, and polymer segments, and can be estimated using the group contribution methods of Van Krevelen. For example, to estimate whether a polymer having a given composition will be miscible with a particular solvent or other small molecule (e.g., having a molecular weight of approximately 500 or less), one calculates $\delta_t^2$ for the polymer and $\delta_t^2$ for the solvent. Typically, if the difference between the two, $\Delta \delta_t^2$, is greater than 25 (i.e., $\Delta \delta_t > 5$), then the polymer and the solvent will not be miscible.

If, instead, it is desired to determine whether two polymers, differing in composition, will be miscible, the same calculations may be carried out, but the predicted upper limit of $\Delta \delta t^2$ for miscibility will decrease as the molecular weight of one or both of the polymers under consideration increases. This decrease is thought to parallel the decrease in entropy of mixing which occurs as the molecular weight of the components being mixed increases. For example, two polymers, each having a degree of polymerization of 100, will likely be immiscible even if the value of $\Delta \delta t^2$ for their mixture is 9, or even 4 (i.e., $\Delta \delta t = 3$, or even 2). Still higher molecular weight polymers may be immiscible at even lower values of $\Delta \delta t$. It is desirable that the precursor components of the present invention are miscible. For example, when precursor components include an alkenyl aryl (thio)ether aryl silicon-based precursor and the hydrido silicon-based precursor, as well as a hydrosilation catalyst, it is desirable that all of them are miscible. It is further desirable that any capping agent present in the curable aryl (thio)ether aryl silicon composition be miscible in the curable aryl (thio)ether aryl silicon composition. Without wishing to be bound by any particular theory, it is thought that miscibility of the components of the curable aryl (thio)ether aryl silicon composition leads to more uniform curing to give a more uniform cured aryl (thio)ether aryl polysiloxane composition than if the precursor components had not been miscible. For example, to estimate whether an alkenyl aryl (thio)ether aryl silicon-based precursor of the present invention, having a given composition, will be miscible with a particular hydrido silicon-based precursor, having another composition, one calculates $\delta t^2$ for each. It will be understood that these calculations provide useful guidelines for one skilled in the art, greatly reducing the amount of experimentation required to achieve a desired result. It is, however, further recognized that the results of such calculations are estimates, and that some experimentation may be needed, in addition to those calculations, to determine particularly advantageous compositions for the curable aryl (thio)ether aryl silicon composition of the present invention. It is further understood that, when two components (e.g., two precursors) of the curable aryl (thio)ether aryl silicon composition display borderline miscibility, or even immiscibility, the selection of a third component miscible with each of those two components may be effective to product a solution in which all three components are miscible. Any two precursor components of a curable aryl (thio)ether aryl silicon composition of the present invention will typically be soluble in that curable aryl (thio)ether aryl silicon composition when present in an amount of: at least 0.1, at least 0.5, or at least 1.0 weight percent; and no more than 99.9, no more than 90, no more than 50, no more than 10 weight percent, or no more than 5 weight percent, based on the weight of the curable aryl (thio) ether aryl silicon composition. Further, when the curable aryl (thio)ether aryl silicon composition contains a single precursor, that precursor may be present in an amount of greater than 99.9 weight percent to 100 weight percent, based on the weight of the curable aryl (thio)ether aryl silicon composition. When a catalytic component (e.g., hydrosilation catalyst) is further present, that catalytic component is typically, though not necessarily (see high RI nanoparticles infra), soluble in the curable aryl (thio)ether aryl silicon composition at its use amount which is usually a few ppm or less, but may be as high as 100 ppm, or even 500 ppm or more.

When hydrosilation is a method used to make the cured aryl (thio)ether aryl polysiloxane of the present invention, a hydrosilation catalyst includes an element from Group VIII of the Periodic Chart of the Elements, present as a metal (i.e., in zero valent elemental form) or as a metal compound (I.e., a metal, in a positive valence state, associated with one or more counter ions; or in an organometallic complex), wherein the element is selected from: platinum, rhodium, palladium, ruthenium, iridium, and combinations thereof; platinum, rhodium, palladium, and combinations thereof; palladium, platinum, and combinations thereof; or platinum. A non-exhaustive list of platinum compounds includes: platinum black; platinum halides such as platinum (II) chloride, $PtCl_4$, $H_2PtCl_4 \cdot 6H_2O$, $Na_2PtCl_4 \cdot 4H2O$, reaction products of $H_2PtCl_4 \cdot 6H2O$ with cyclohexene, and reaction products of chloroplatinic acid and monohydric alcohols (such as Lamoreaux Catalyst); platinum-olefin complexes, such as Karstedt's catalyst, platinum carbonyl cyclovinylmethylsiloxane complex, and platinum cyclovinylmethylsiloxane complex; platinum-alcohol complexes; platinum-alcoholate complexes; platinum-ether complexes; platinum-aldehyde complexes; platinum-ketone complexes, such as platinum bisacetoacetate; platinum carbene complexes, reaction products of platinum tetrachloride with olefins and amines; platinum-vinylsiloxane complexes such as platinum-1,3-divinyl-1,1,3,3-tetramethyldisiloxane complex; bis-(γ-picoline)-platinum dichloride; trimethylenedipyridine-platinum dichloride, dicyclopentadiene-platinum dichloride, cyclooctadiene-platinum dichloride; cyclopentadiene-platinum dichloride; bis(alkynyl)bis(triphenylphosphine)-platinum complex; bis(alkynyl)(cyclooctadiene)-platinum complex; dimethylsulfoxyethyleneplatinum (II) chloride; and combinations thereof.

When a hydrosilation catalyst is present in the curable aryl (thio)ether aryl silicon composition of the present invention, it will be present in any amount effective to cause hydrosilation reaction between silicon bonded alkenyl groups and silicon bonded hydrogen atoms of silicon-based precursor components. This amount, expressed as a Group VIII element equivalent value, will typically be: at least 0.005, at least 0.01, or at least 0.1 ppm; and no more than 500, no more than 100, no more than 10, no more than 3.0, no more than 2, less than 1, less than 0.6 ppm, or no more than 0.5 ppm, based on the weight of the curable aryl (thio)ether aryl silicon composition. The hydrosilation catalyst, and any derivatives thereof, are similarly present in the cured aryl (thio)ether aryl polysiloxane composition in a combined amount, expressed as a Group VIII element equivalent value, of: at least 0.005, at least 0.01, or at least 0.1 ppm; and no more than 500, no more than 100, no more than 10, no more than 3.0, no more than 2, less than 1, less than 0.6 ppm, or no more than 0.5 ppm, based on the weight of the curable aryl (thio)ether aryl silicon composition. However, when hydrosilation is a method used to prepare the cured aryl (thio)ether aryl polysiloxane and it is further desired that the cured aryl (thio)ether aryl polysiloxane pass the accelerated heat aging test, the hydrosilation catalyst is present in the curable aryl (thio)ether aryl silicon composition in an amount, expressed as a Group VIII element equivalent value, of: at least 0.005, at least 0.01, or at least 0.1 ppm; and no more than 3.0, no more than 2, less than 1, less than 0.6 ppm, or no more than 0.5 ppm, based on the weight of the curable aryl (thio)ether aryl silicon composition. Further, a suitable upper limit for the amount of the hydrosilation catalyst and derivatives thereof may even be 0.45 ppm or lower, expressed as a Group VIII element equivalent value. The hydrosilation catalyst, and any derivatives thereof, are then similarly present in the cured aryl (thio)ether aryl polysiloxane composition in a combined amount, expressed as a Group VIII element equivalent value, of: at least 0.005, at least 0.01, or at least 0.1 ppm; and no more than 3.0, no more than 2, less than 1, less than 0.6 ppm, or no more than 0.5 ppm, based on the total weight of the cured aryl (thio)ether aryl polysiloxane composition. Further, a suitable upper limit for the amount of the hydrosilation catalyst and derivatives thereof may even be 0.45 ppm or lower, expressed as a Group VIII element equivalent value. One skilled in the art will recognize that portions or all of a hydrosilation catalyst may be converted to derivatives, including other catalytic species and inactive degradation products, during or after curing. Hence, the amounts of both hydrosilation catalyst and derivatives thereof are expressed as a Group VIII element equivalent value. It will further be recognized that, when the method by which silicon-based precursor components are joined during formation of the cured aryl (thio)ether aryl polysiloxane does not include hydrosilation, the level of hydrosilation catalyst will typically be zero.

Suitable hydrosilation catalysts of the present invention include discrete molecules (i.e., small molecules, or individual polymeric chains) in the curable aryl (thio)ether aryl silicon composition and in the cured aryl (thio)ether aryl polysiloxane composition. Other suitable hydrosilation catalysts include Group VIII metal nanoparticles having an average particle diameter of at least 1 nm, at least 2 nm, or at least 5 nm; and no more than 30 nm, no more than 20 nm, or no more than 10 nm. Suitable hydrosilation catalysts may further be used in a microencapsulated form, wherein microcapsules include ultra fine particle of a thermoplastic resin such as a polyester resin or a silicone resin) containing the hydrosilation catalyst. The hydrosilation catalyst may also be used in the form of a clathrate compound such as cyclodextrin.

The "silicon bonded aryl group" of the present invention includes any group containing at least one aromatic ring, wherein the aromatic ring may be substituted or unsubstituted, provided that the aryl group is either inert to curing conditions or, if reactive, does not contribute to loss of desirable properties of the cured aryl (thio)ether aryl polysiloxane composition, properties which may include color development, physical integrity, and transparency. A non-exhaustive list of silicon bonded aryl groups includes: phenyl; halophenyl groups such as o-chlorophenyl, m-chlorophenyl, p-chlorophenyl, and dichlorophenyl; alkyl phenyl groups having $C_1$-$C_{12}$ alkyl groups such as tolyl, xylyl, ethyl-substituted phenyl, and t-butyl-substituted phenyl; aryl (thio)ether aryl groups such as aryloxyaryl groups, examples of which include o-phenoxyphenyl, m-phenoxyphenyl, and p-phenoxyphenyl, and such as arylthioaryl groups, examples of which include o-phenylthiophenyl, m-phenylthiophenyl, and p-phenylthiophenyl; heteroatom phenyl groups having heteroatom substituents bonded to the phenyl ring as a monovalent substituent or as a ring-fused variant, such as arylimides; aralkyl groups such as benzyl or phenethyl; fused ring aryls such as naphthyl; and combinations thereof. A suitable silicon bonded aryl group may be selected from phenyl; aryl (thio)ether aryl groups such as aryloxyaryl groups, examples of which include o-phenoxyphenyl, m-phenoxyphenyl, and p-phenoxyphenyl and such as arylthioaryl groups, examples of which include o-phenylthiophenyl, m-phenylthiophenyl, and p-phenylthiophenyl; naphthyl or combinations thereof. A suitable silicon bonded aryl group may be selected from phenyl; o-phenoxyphenyl, m-phenoxyphenyl, p-phenoxyphenyl; and combinations thereof. It is a requirement of the present invention that the silicon bonded aryl group include an aryl (thio)ether aryl group.

"Ring structure a" infra of the silicon bonded aryl (thio)ether aryl group of the present invention has a ring carbon atom (i.e., the carbon bearing no R-group in "ring structure a'') covalently bonded directly to a silicon atom of a cured aryl (thio)ether aryl polysiloxane composition of the present invention. As such, the silicon bonded aryl (thio)ether aryl group has "ring structure a" having a ring carbon atom covalently bonded directly to a silicon atom of at least one silicon-based precursor to the cured aryl (thio)ether aryl polysiloxane composition. At least one of substituents $R^{13}$-$R^{17}$ of "ring structure a" is "ring structure b" wherein the two ring structures are joined through atom "Y" which is oxygen or sulfur. That is, atom "Y" is covalently bonded to the aromatic ring shown for "ring structure a" and to the aromatic ring shown for "ring structure b". "Ring structure c" illustrates a para-aryl (thio)ether aryl group. If each of $R^{13}$-$R^{14}$ and $R^{16}$-$R^{22}$ is a hydrogen atom, Y is oxygen, and $R^{15}$ is ring structure b, then ring structure c is a p-phenoxyphenyl group. If instead ring structure b is attached as $R^{14}$ and $R^{15}$ is a hydrogen atom, ring structure c becomes meta-phenoxyphenyl. Similarly, if ring structure b is attached as $R^{13}$ and each of $R^{14}$-$R^{22}$ is a hydrogen atom, ring structure c becomes ortho-phenoxyphenyl. Substitution of sulfur for oxygen as "Y" in any of the three groups just exemplified results in, respectively, p-, m-, and o-phenylthiophenyl substituents.

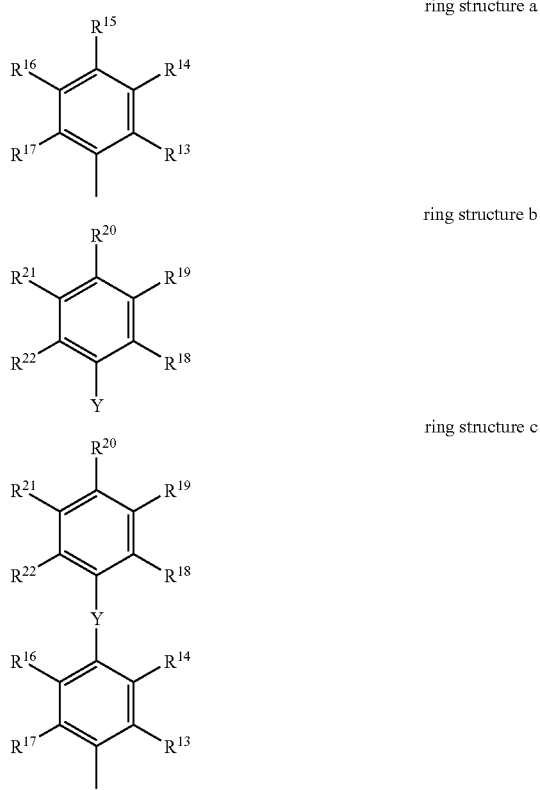

Provided that at least one of substituents $R^{13}$-$R^{17}$ of "ring structure a" is "ring structure b" wherein the two ring structures are joined through atom "Y" which is oxygen or sulfur, substituents $R^{13}$-$R^{22}$ may be, independently, any substituent group that does not cause the cured aryl (thio)ether aryl polysiloxane of the present invention to degrade under conditions of preparation and use. A variety of applications require that the curable aryl (thio)ether aryl silicon compositions of the present invention be fluid. In such case, it is desirable that the aryl (thio)ether aryl group be selected to impart fluidity.

For example, phenoxyphenyl groups (e.g., ortho-, meta-, para-, and combinations thereof), alone or in combination with other substituents such as phenyl and methyl, impart fluidity to silicon-based precursors and to curable aryl (thio)ether aryl silicon compositions. Typically, $R^{13}$-$R^{22}$ of the aryl (thio)ether aryl group are independently selected from hydrogen atom; alkyl; phenyl; substituted phenyl; aryloxy; substituted aryloxy; arylthio; substituted arylthio; halogen; and naphthyl.

When present, the "alkenyl silicon-based precursor" of the present invention includes at least two silicon bonded alkenyl groups. Silicon bonded alkenyl groups are present in the alkenyl silicon-based precursor in an amount of at least 0.1, at least 1, or at least 5 mol %; and no more than 60, no more than 30, or no more than 10 mol %, based on the total silicon bonded organic groups of the alkenyl silicon-based precursor. Silicon bonded aryl (thio)ether aryl groups are present in the alkenyl silicon-based precursor in an amount of 0, at least 10, at least 30, or at least 40 mol %; and no more than 99.9, no more than 90, no more than 80, or no more than 70 mol %, based on the total silicon bonded organic groups of the alkenyl silicon-based precursor. It is understood that, if a silicon bonded aryl (thio)ether aryl group is not present in an alkenyl silicon-based precursor, it will be present in at least one other silicon-based precursor of the curable aryl (thio)ether aryl silicon composition.

Silicon bonded alkenyl groups include: vinyl; monoethylenically unsaturated $C_3$-$C_{18}$ linear, branched, or cyclic hydrocarbons such as allyl, prop-1-en-1-yl, hex-1-en-1-yl, and hex-5-en-1-yl; vinyl substituted aryl groups such as p-vinylphenyl, and combinations thereof. The suitable silicon bonded alkenyl group may be selected from vinyl, or allyl, and combinations thereof. The suitable alkenyl group may further be vinyl.

In the cured aryl (thio)ether aryl polysiloxane composition of the present invention, an aryl (thio)ether aryl polysiloxane is represented by the average compositional Formula I,

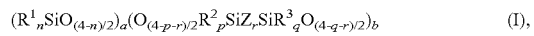

wherein:
for each $(R^1_n SiO_{(4-n)/2})$ unit:
  subscript n equals independently 0, 1, 2, or 3;
for each $(O_{(4-p-r)/2}R^2_p SiZ_r SiR^3_q O_{(4-q-r)/2})$ unit:
  subscript p equals 0, 1, 2, or 3;
  subscript q equals 0, 1, 2 or 3;
  p+q=0 to [8−(2r+1)];
  subscript r=1, 2, or 3;
  Z is selected from —CHR$^4$CHR$^5$—X$_s$—, arylene, substituted arylene, and combinations thereof, wherein:
    —CHR$^4$CHR$^5$—X$_s$— is the silicon-bridging alkylene moiety
    X is independently selected from methylene, phenyl, substituted phenyl, oxygen, and combinations thereof;
    subscript s=0 or 1; and
    $R^4$ and $R^5$ are independently selected from hydrogen atom, aryl (thio)ether aryl, and alkyl;
$R^1$, $R^2$, and $R^3$ include a silicon-bonded organic group selected from alkenyl, hydrogen atom, aryl, alkyl, hydroxy, alkoxy, aryloxy, aryl (thio)ether aryl, other hydrocarbon radical, and combinations thereof;
at least one of $R^1$, $R^2$, and $R^3$ includes a silicon bonded aryl (thio)ether aryl group;

subscripts a and b are selected to conform with the mole fraction of the $(R^1{}_n SiO_{(4-n)/2})$ unit and the $(O_{(4-p-r)/2}R^2{}_p SiZ_r SiR^3{}_q O_{(4-q-r)/2})$ unit, respectively;

$0 \leq a \leq 1$; $0 \leq b \leq 1$; and a+b=1.

Subscripts "a" and "b" represent mole fractions. For example, an alkylene bridged aryl (thio)ether aryl polysiloxane having 4 $(R^1{}_n SiO_{(4-n)/2})$ units and 6 $(O_{(4-p-r)/2}R^2{}_p SiZ_r SiR^3{}_q O_{(4-q-r)/2})$ units would have Formula I "a" and "b" values or 0.4 and 0.6, respectively.

In a suitable aryl (thio)ether aryl polysiloxane of Formula I, the mole percent of the combined R-groups, $R^1$, $R^2$, and $R^3$ of the aryl (thio)ether aryl polysiloxane of Formula I which are selected from vinyl, hydrogen atom, methyl, phenyl, naphthyl, and aryl (thio)ether aryl is at least 70, at least 90, or at least 95 mole percent; and 100, no more than 99, or no more than 97 mole percent, based on total moles of silicon bonded organic groups of the aryl (thio)ether aryl polysiloxane. In another suitable aryl (thio)ether aryl polysiloxane of Formula I, the mole percent of the combined combined R-groups, $R^1$, $R^2$, and $R^3$ of the aryl (thio)ether aryl polysiloxane of Formula I which are selected phenyl and phenoxyphenyls is at least 70, at least 90, or at least 95 mole percent; and no more than 100, no more than 99, or no more than 97 mole percent, based on total moles of silicon bonded organic groups of the aryl (thio)ether aryl polysiloxane. The composition of the precursor components present in the curable aryl (thio)ether aryl silicon composition of the present invention will, of course, be such that the mole percents recited for the cured composition are achieved.

The cured aryl (thio)ether aryl polysiloxane of the present invention, when formed using hydrosilation, will include a silicon-bridging alkylene moiety. Because silicon bonded alkenyl groups include: vinyl; monoethylenically unsaturated $C_3$-$C_{18}$ linear, branched, or cyclic hydrocarbons, along with vinyl substituted aryl groups, the number of carbon atoms included in the $CHR^4CHR^5$ unit of a silicon-bridged alkylene moiety will typically be 2-18 carbon atoms. As such, $R^4$ and $R^5$ may each include 0-16 carbon atoms, with the combined number of carbon atoms of $R^4$ and $R^5$ ranging from 0-16. In fact, while typically there will be 2-18 carbon atoms in the $CHR^4CHR^5$ unit, there is no particular limit on the total number of carbon atoms in the $CHR^4CHR^5$ unit.

The number average molecular weight, $M_n$, of the cured aryl (thio)ether aryl polysiloxane of the present invention is at least 328, at least 500 g/mole, or at least 1,000 g/mole and there is no particular upper limit, given that the cured aryl (thio)ether aryl polysiloxane can be a single crosslinked molecule having an indeterminately high molecular weight, or can include multiple crosslinked molecules. Herein, the term "crosslink" means that two reactive silicon bonded organic groups having complementary reactivity (i.e., the ability to react with one another), and present as silicon bonded organic groups on any of the silicon-based precursors, have reacted to form a crosslink (e.g., an alkylene bridge is formed by the reaction of a silicon bonded hydrogen atom with a silicon bonded vinyl, or a silicon bonded hydroxyl group reacts with a silicon bonded alkoxy group to form an Si—O—Si linkage). The $M_n$ of a suitable curable aryl (thio)ether aryl polysiloxane may be at least 328, at least 500 g/mole, or at least 1,000 g/mole; and no more than 300,000, no more than 200,000, no more than 50,000, no more than 10,000 g/mole; and the MWD polydispersity, $M_w/M_n$, may be at least 1.00, at least 1.01, at least 1.1, or at least 1.2; and no more than 50, no more than 20, no more than 10, or no more than 3. One of skill in the art will further recognize, that the cured aryl (thio)ether aryl polysiloxane may include a mixture of one or more very large crosslinked aryl (thio)ether aryl polysiloxane molecules (i.e., having an $M_n$ of 200,000, 300,000, 1,000,000, or indeterminately high) with smaller aryl (thio)ether aryl polysiloxane molecules, such that the MWD is bimodal, or multimodal.

The "silicon-based precursor component" ("silicon-based precursor") of the present invention is represented by an average compositional formula selected from Formula II,

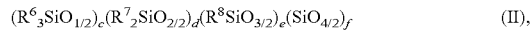

wherein:

$R^6{}_3 SiO_{1/2}$, $R^7{}_2 SiO_{2/2}$, $R^8 SiO_{3/2}$, and $SiO_{4/2}$ are, respectively, an M-unit, a D-unit, a T-unit, and a Q-unit, all of which are primary siloxane units;

subscripts c, d, e, and f are selected to conform with the mole fraction of $R^6{}_3 SiO_{1/2}$, $R^7{}_2 SiO_{2/2}$, $R^8 SiO_{3/2}$, and $SiO_{4/2}$, respectively;

$0.001 \leq c \leq 1$; $0 \leq d \leq 0.999$; $0 \leq e \leq 0.50$; $0 \leq f \leq 0.10$;

c+d+e+f=1;

and

Formula V,

and combinations thereof, wherein:

the silicon bonded alkenyl group is present in the silicon in an amount of 0 mole percent to no more than 60 mole percent, based on total moles of the silicon bonded organic groups of the silicon precursor component;

the silicon bonded hydrogen atom in the silicon in an amount of 0 mole percent to no more than 60 mole percent, based on total moles of the silicon bonded organic groups of the silicon precursor component;

the silicon bonded aryl (thio)ether aryl group is present in the silicon precursor in an amount of at least 0 mole percent to no more than 99.9 mole percent, based on total moles of the silicon bonded organic groups of the silicon precursor;

$R^6$-$R^8$ and combined include a silicon bonded organic group selected from alkenyl, hydrogen atom, aryl, alkyl, hydroxy, alkoxy, aryloxy, aryl (thio)ether aryl, other hydrocarbon radical, and combinations thereof; and $R^{13}$ includes a silicon bonded organic group selected from alkenyl, hydrogen atom, aryl, alkyl, hydroxy, alkoxy, aryloxy, aryl (thio)ether aryl, other hydrocarbon radical, and combinations thereof.

Although it is not necessary that a silicon-based precursor component have an aryl (thio)ether aryl group, at least one "silicon-based precursor component" of a curable aryl (thio) ether aryl silicon composition must contain an aryl (thio)ether aryl group.

The viscosity of a silicon-based precursor, or of a non-silicon based precursor (e.g., capping agent) of the present invention is: at least 1, at least 10, or at least 100 centipoise; and no more than 100,000, no more than 10,000, or no more than 1,000 centipoise at 25° C. The viscosity of the curable aryl (thio)ether aryl silicon composition is: at least 10, or at least 100 centipoise; and no more than 2,000,000, no more than 1,000,000, no more than 100,000, no more than 10,000, or no more than 1,000 centipoise at 25° C. When a curable aryl (thio)ether aryl silicon composition is used in an application requiring good flow characteristics (e.g., when filing molds, or coating substrate surfaces), it is desirable that the curable composition fill cavities completely and spread well across surfaces without spreading excessively or splashing. In such case, suitable viscosities for the curable aryl (thio) ether aryl silicon composition at critical use temperatures prior to, and in some cases during, curing are typically: at least 100, at least 500, or at least 1,000 centipoise; and no more than 50,000, no more than 20,000, no more than 10,000, or no more than 5,000 centipoise.

A non-exhaustive list of alkenyl silicon-based precursors includes, for example: vinyldimethylsilyl-terminated (phenoxyphenyl)phenylsiloxane, vinyldimethylsilyl-terminated (phenoxyphenyl)methylsiloxane, vinyldimethylsilyl-terminated (phenylthiophenyl)phenylsiloxane, vinyldimethylsilyl-terminated (phenylthiophenyl)methylsiloxane, vinyldiphenylsilyl-terminated bis(p-phenoxyphenyl)siloxane, vinyl(phenyoxyphenyl)phenyl-terminated bis(p-phenylthiophenyl)siloxane, vinyldimethylsilyl-terminated poly(phenylmethylsiloxane), vinyldimethylsilyl-terminated poly(phenylmethylsiloxane-co-diphenylsiloxane), vinyldimethylsilyl-terminated poly[(phenoxyphenyl)phenylsiloxane-co-diphenylsiloxane], vinylmethylphenylsilyl-terminated poly(phenylmethylsiloxane), vinylmethylphenylsilyl-terminated poly(phenylmethylsiloxane-co-diphenylsiloxane), vinyldimethylsilyl-terminated poly(phenylmethylsiloxane-co-vinylmethylsiloxane), vinyldimethylsilyl-terminated poly(phenylmethylsiloxane-co-diphenylsiloxane-co-vinylmethylsiloxane), vinylmethylphenylsilyl-terminated poly(phenylmethylsiloxane-co-vinylmethylsiloxane), vinylmethylphenylsilyl-terminated poly(phenylmethylsiloxane-co-diphenylsiloxane-co-vinylmethylsiloxane); divinyldiphenyldimethyldisiloxane, 1,5-divinyl-1,5-dimethyl-tetraphenyltrisiloxane, 1,5-divinyl-hexaphenyltrisiloxane, and combinations thereof.

Silicon bonded hydrogen atoms are present in the (optional) hydrido silicon-based precursor of the present invention in an amount of at least 0.1, at least 1, or at least 5 mol %; and no more than 60, no more than 30, or no more than 10 mol %, based on the total silicon bonded organic groups of the hydrido silicon-based precursor. Silicon bonded aryl (thio) ether aryl groups are present in the hydrido silicon compound in an amount of: at least 0, at least 10, at least 30, or at least 40 mol %; and no more than 99.9, no more than 90, no more than 80, or no more than 70 mol %, based on the total silicon bonded organic groups of the hydrido silicon-based precursor.

In a suitable curable aryl (thio)ether aryl silicon composition of the present invention, a hydrido silicon-based precursor includes a hydrido silicon compound selected from:

i) a hydrido silicon compound having the average compositional formula III,

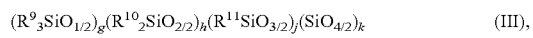

wherein:
$R^9{}_3SiO_{1/2}$, $R^{10}{}_2SiO_{2/2}$, $R^{11}O_{3/2}$, and $SiO_{4/2}$ are, respectively, an M-unit, a D-unit, a T-unit, and a Q-unit, all of which are primary siloxane units;

subscripts g, h, j, and k are selected to conform with the mole fraction of $R^9{}_3SiO_{1/2}$, $R^{10}{}_2SiO_{2/2}$, $R^{11}SiO_{3/2}$, and $SiO_{4/2}$, respectively;

$0.001 \leq g \leq 1$; $0 \leq h \leq 0.999$; $0 \leq j \leq 0.50$; $0 \leq f \leq 0.10$;

$g+h+j+k=1$;

the silicon bonded hydrogen atom is present in the hydrido silicon compound in an amount of at least 0.1 mole percent to no more than 60 mole percent, based on total moles of the silicon bonded organic groups of the hydrido silicon compound; and $R^9$-$R^{11}$ are selected from alkenyl, hydrogen atom, aryl, alkyl, hydroxy, alkoxy, aryloxy, aryl (thio)ether aryl, other hydrocarbon radical, and combinations thereof; and ii) a hydrido silicon compound having the formula IV:

wherein:
m=1, or 2; and
$R^{12}$ is selected from alkenyl, aryl, alkyl, hydroxy, alkoxy, aryloxy, aryl (thio)ether aryl, other hydrocarbon radical, and combinations thereof;
and
combinations thereof.

There is no particular limit to the $M_n$, the $M_w$, or the MWD polydispersity, $M_w/M_n$, of the silicon-based precursor of the present invention. Further, the silicon-based precursor may be single, well defined compound having a single molecular weight, or it may be of a collection of polymeric chains having a distribution of chain lengths and, hence, molecular weights. Typically, the $M_n$ for either is at least 100, at least 500 g/mole; and no more than 200,000, no more than 100,000, no more than 50,000, no more than 30,000, no more than 10,000, or no more than 2,000 g/mole. Typically, the MWD polydispersity, $M_w/M_n$, for either is at least 1.00, at least 1.01, at least 1.1, or at least 1.2; and no more than 20, no more than 10, or no more than 3.

A non-exhaustive list of hydrido silicon compounds includes, for example: hydride terminated poly(phenyl-(dimethylhydrosiloxy)siloxane), hydride terminated poly[(phenoxyphenyl)phenylsiloxane, hydride terminated poly(diphenoxyphenyl)siloxane, hydride terminated poly[(phenylthiophenyl)phenylsiloxane, hydride terminated poly (methylhydrosiloxane-co-phenylmethylsiloxane), phenyltris (dimethylsiloxy)silane, phenylsilane, diphenylsilane, 1,3-diphenyl-1,1,3,3-tetrakis(dimethylsiloxy)disiloxane, and combinations thereof.

Groups $R^1$-$R^3$ and $R^6$-$R^{13}$ of the present invention are exemplified by the following lists. A non-exhaustive list of alkyl groups includes: methyl, $C_2$-$C_{12}$ alkyl wherein the alkyl portion is linear, branched or cyclic, such as ethyl, propyl, isopropyl, cyclohexyl, butyl, and isobutyl; halosubstituted alkyls such as 3,3,3-trifluoropropyl; and alkoxysubstituted alkyl such as methoxy methyl. The suitable alkyl group may be selected from methyl or ethyl, and combinations thereof. The suitable alkyl group may be methyl. Alkenyl groups include, for example, vinyl, 1-hexenyl, 5-hexenyl, allyl, 2-hexenyl, and vinyl phenyl (i.e., styrenic groups bound to silicon through a covalent bond with a carbon of the phenyl ring). A suitable alkenyl group may be selected from vinyl or allyl, and combinations thereof. The suitable alkenyl group may be vinyl. Suitable alkenyl groups may include at least one vinyl phenyl group. Alkoxy groups include, for example: methoxy, $C_2$-$C_{12}$ alkoxy wherein the alkyl portion is linear, branched or cyclic, such as ethoxy, propoxy, isopropoxy, butoxy, and t-butoxy. A suitable alkoxy group may be selected from methoxy or ethoxy, and combinations thereof. The suitable alkoxy group may be methoxy. Aryloxy groups include, for example: phenoxy; phenoxy having one or more alkoxy, aryloxy, or halo substitutents attached to the phenyl ring. These aryloxy groups, having an oxygen atom linking the aryl group with the silicon atom, are not to be confused with the aryl (thio)ether aryl group of the present invention. One skilled in the art will recognize that other hydrocarbon radicals beyond the types and specific groups listed supra, may be present as $R^1$-$R^3$ and $R^6$-$R^{13}$. Typically, these other hydrocarbon radicals are present in an amount of 0 mol % to no more than 10 mol %, based on total moles of the silicon bonded organic groups present in the molecule. Even greater than 10 mol % of other hydrocarbon radicals may be present, provided deleterious effects upon curing and characteristics of the cured aryl (thio)ether aryl polysiloxane, such as resistance to heat aging, are minimal or non-existent. A non-exhaustive list of types of other hydrocarbon radicals includes: amines, nitriles; (meth)acrylates, epoxides, amides, imides, and combinations thereof.

In the curable aryl (thio)ether aryl silicon composition of the present invention, when hydrosilation is a method of curing, the mole ratio of silicon bonded hydrogen atoms of the hydrido silicon-based precursor to silicon bonded alkenyl groups of the alkenyl silicon-based precursor is at least 0.5, at least 0.8, or at least 1.0; and no more than 3.0, no more than 2.0, or no more than 1.5.

The capping agent of the present invention includes capping agents selected from: "alkenyl capping agent"; "hydride capping agent"; "alkoxy capping agent", "aralkoxy" or "hydroxy capping agent". An alkenyl capping agent includes an "alkenyl capping moiety" which is a moiety capable of reacting with a silicon bonded vinyl group. Typically, an alkenyl capping moiety is a "hydrido silicon bond" (i.e., an Si—H bond). Illustrative examples of alkenyl capping agents include: trimethyl silane, triphenyl silane, methyl phenyl silanes, and pentaphenyl disiloxane. A hydride capping agent includes a "hydride capping moiety" which is a moiety capable of reacting with a silicon bonded hydride group. Typically, a hydride capping moiety is an alkenyl group. Illustrative examples of a hydride capping agent include: trimethyl vinyl silane, triphenyl vinyl silane, and pentaphenyl vinyl disiloxane. An alkoxy capping agent includes an alkoxy capping moiety which is a moiety capable of reacting with a silicon bonded alkoxy group. Typically, an alkoxy capping moiety is selected from alkoxy, water, or hydroxy, and combinations thereof. Illustrative examples of alkoxy capping agents include: trimethyl methoxy silane, triphenyl methoxy silane, triphenyl ethoxy silane, and pentaphenyl methoxy disiloxane. A hydroxy capping agent includes a "hydroxy capping moiety" which is a moiety capable of reacting with a silicon bonded hydroxyl group. Typically a hydroxy capping moiety is selected from alkoxy or hydroxy, and combinations thereof. Illustrative examples of hydroxy capping agents include: trimethyl methoxy silane, triphenyl methoxy silane, triphenyl ethoxy silane, and pentaphenyl methoxy disiloxane. One of skill in the art will further recognize that the capping agent of the present invention may include capping moieties other than those explicitly indicated supra, provided those other capping agents include capping moieties reactive with silicon bonded alkenyl, hydride, alkoxy, aralkoxy, or hydroxyl groups without adversely affecting the curing reaction or the cured aryl polysiloxane composition. A capping agent may include one or more aryl (thio)ether aryl groups, or it may be free of aryl (thio)ether aryl groups.

The refractive index of the cured aryl (thio)ether aryl polysiloxane composition of the present invention is: at least 1.50, at least 1.55, or at least 1.58; and no more than 1.67, no more 1.65, no more than 1.63, no more than 1.62. These limits for refractive index are limits in the absence of high RI additives such as high RI nanoparticles. Addition of high RI nanoparticles may increase the upper limits for refractive index of the cured aryl (thio)ether aryl polysiloxane composition to no more than 2.5, no more than 2.1, or no more than 1.8.

The refractive index of the curable aryl (thio)ether aryl silicon composition of the present invention is: at least 1.50, at least 1.55, or at least 1.58; and no more than 1.67, no more 1.65, no more than 1.63, no more than 1.62. These limits for refractive index are limits in the absence of high RI additives such as high RI nanoparticles. Addition of high RI nanoparticles may increase the upper limits for refractive index of the curable aryl (thio)ether aryl silicon composition to no more than 2.5, no more than 2.1, or no more than 1.8.

The cured aryl (thio)ether aryl polysiloxane composition of the present invention may further include an additive. One or more additives may be included in the cured polysiloxane. A non-exhaustive list of additives includes: nanoparticle or microparticle sized fillers such as ceria, titania, silica, zirconia, hafnium oxide, vanadium oxide, lanthanum oxide; antioxidants; hindered amine light stabilizers (HALS); lubricity additives; fungicides; flame retardants; contrast enhancers; UV-stabilizers; photostabilizers; surfactants; adhesive modifiers such as alkoxy-containing silanes, alkoxy-containing silicones, and epoxy silicones); phosphors; absorbing dyes; fluorescent dyes; electrical or thermal conductivity additives such as carbon nanotubes or nanoparticles; chelation or sequestration agents acid scavengers; base scavengers; and metal passivators and fortifiers such as fluorescing powders, nanotubes, nanospheres, nanoparticles, microspheres, pigments, liquid crystals, and clays.

High RI nanoparticles or other additives may be added to the curable aryl (thio)ether aryl silicon composition to raise its refractive index and the refractive index of the corresponding cured aryl (thio)ether aryl polysiloxane composition. Such refractive index raising additives include, for example, ceria, titania, zirconia, hafnium oxide, vanadium oxide, lanthanum oxide, zinc oxide, tungstates, molybdates, niobium oxide, indium oxide, indium tin oxide, hexaphenyldisiloxane, tetraphenyllead, and tetraphenylsilane. The plural high RI nanoparticles of the present invention have an average particle diameter of at least 1 nm, at least 2 nm, or at least 5 nm; and no more than 30 nm, no more than 20 nm, or no more than 10 nm. When the application for the cured aryl (thio)ether aryl polysiloxane composition requires high light transmission, it is a further requirement that the plural high RI nanoparticles not significantly diminish that light transmission of the specimen to a value below 90%. There is no particular limit to the PSD polydispersity for the plural high RI nanoparticles, however, the PSD polydispersity for the plural high RI nanoparticles is typically at least 1.00, at least 1.01, at least 1.1, or at least 1.2; and no more than 20, no more than 10, or no more than 3. The PSD may be unimodal or multimodal.

Furthermore, cure inhibitors, auxiliary catalysts, adhesion promoters, surface passivation agents, and passivation agents for mobile ionic species can be included in the curable aryl siloxane composition and in the cured aryl (thio)ether aryl polysiloxane composition of the present invention.

Cure inhibitors include, for example: acetylene alcohols such as 3-methyl-3-butyn-2-ol, 2-methyl-1-pentyn-3-ol, 3,5-dimethyl-1-hexyn-3-ol, 2,5-dimethyl-3-hexyn-2,5-diol, 3,6-dimethyl-4-octyne-3,6-diol, 2,4,7,9-tetramethyl-5-decyne-4,7-diol, and 3,7-dimethyl-6-octen-1-yn-3-ol ("dehydrolinalool" from BASF); triazoles; hydrosilanes such as 1,1,3,3-tetramethyldisiloxane; dialkylformamides; alkylthioureas; methyl ethyl ketoxime; organosilicon compounds with aliphatic triple bonds and suitable boiling points; maleic monoesters; mixtures of diallyl maleate and vinyl acetate; nitrile compounds; and phosphorous compounds. Auxiliary catalysts include, for example metal oxides such as oxides of titanium, tin, zirconium, and lead. These same metal oxides may further be capable of acting as adhesion promoters. Passivation agents, typically preventing interaction with water by lowering surface energy, include, for example, poly [(3,3,3-trifluoropropyl)methylsiloxane], (3,3,3-trifluopropyl)trimethoxysilane, (heptadecafluoro-1,1,2,2-tetrahydrodecyl)triethoxysilane, (tridecafluoro-1,1,2,2,-tetrahydrooctyl)trimethoxysilane, (tridecafluoro-1,1,2,2-tetrahydrooctyl)dimethylchlorosilane, and 3,5-bis(trifluoromethyl)phenyldimethylchlorosilane.

A carrier solvent may also be included in the curable aryl (thio)ether aryl silicon composition in order to form high temperature resistant cured aryl (thio)ether aryl polysiloxane coatings. A non-exhaustive list of suitable solvents includes toluene, xylenes, acetone, ether-based solvents (dowanols, glymes, alkyl ethers), and halogenated solvents. All solvents that are miscible with the curable aryl siloxane composition of the present invention or the cured aryl (thio)ether aryl polysiloxane composition of the present invention can be included in those compositions.

When the method of making the cured aryl (thio)ether aryl polysiloxane composition of the present invention includes hydrosilation, one of skill in the art will recognize that curing temperatures and times may be varied to accommodate specific curable aryl (thio)ether aryl silicon compositions and hydrosilation catalyst levels. Typically, the curing temperature is selected such that a cured aryl (thio)ether aryl polysiloxane composition is formed within a few minutes to several hours, and can be at least 100, at least 120, or at 140° C.; and no more than 220, no more than 200, or no more than 180° C. Suitable methods of making the cured aryl (thio)ether aryl polysiloxane composition may further include curing temperatures above and below the temperature extrema of just stated. Curing temperatures below 100° C. may be desirable for particularly reactive systems or for sensitive electronic devices, while curing temperatures above 220° C. may be desirable for particularly unreactive systems that are also particularly stable to high temperatures during and after curing. Of course, characteristics of each curable aryl (thio)ether aryl silicon composition such as the volatility of components must also be considered when selecting curing conditions. It is further understood that the curing temperature may be varied during curing. For example, the curing temperature might be set initially to be 130° C., but programmed to rise to 150° C. during 2 hours, followed by an 8 hour final curing time interval at 180° C. Typically, the alkenyl silicon-based precursor and the hydrosilation catalyst will be combined prior to addition of the hydrido silicon-based precursor to assure uniform distribution of the hydrosilation catalyst prior to its interaction with silicon bonded hydrogen atoms. Such interaction in the absence of readily accessible alkenyl silicon-based precursor can lead to precipitation of products of that interaction, rendering difficult, or impossible, formation of a uniform, fully curable reaction mixture upon subsequent addition of alkenyl silicon-based precursor. It is further possible to combine the hydrosilation catalyst with mixtures containing both an alkenyl silicon-based precursor and a hydrido silicon-based precursor.

The method of making the cured aryl (thio)ether aryl polysiloxane composition of the present invention includes the steps of:
  providing a curable aryl (thio)ether aryl silicon composition comprising a silicon-based precursor, wherein: at least one silicon-based precursor includes a silicon bonded aryl (thio)ether aryl group; and at least one silicon-based precursor is a multi-linkable precursor including two or more reactive groups capable of reacting with a complementary reactive group of the same or other multi-linkable precursor;
  and curing the curable aryl (thio)ether aryl silicon composition to form the cured aryl (thio)ether aryl polysiloxane composition.

The method may further including the steps of: providing a semiconductor device including semiconductor elements; and forming a coating on at least one surface of at least one of the semiconductor elements by a technique including steps selected from:
  applying the curable aryl (thio)ether aryl silicon composition to the surface before or during the step of curing;
  applying the cured aryl (thio)ether aryl polysiloxane composition to the surface; and combinations thereof.

When the curable aryl (thio)ether aryl silicon composition includes: a hydrosilation catalyst; the hydrosilation catalyst is a metal or metal compound including a Group VIII element selected from platinum, rhodium, palladium, and combinations thereof; at least one multi-linkable precursor is an alkenyl aryl (thio)ether aryl siloxane including at least two silicon bonded alkenyl groups; at least one multi-linkable precursor is a hydrido aryl (thio)ether aryl silicon compound including at least two silicon bonded hydrogen atoms, the method may further include the optional, step of purifying the cured aryl (thio)ether aryl polysiloxane composition by a technique including one or more steps selected from: removing at least a portion of the hydrosilation catalyst; deactivating at least a portion of the hydrosilation catalyst; and combinations thereof. Deactivation may be accomplished, for example, by treatment of the cured aryl (thio)ether aryl polysiloxane composition with deactivating species including, but not limited to ammonia, amines such as trimethyl amine and triethyl amine, and thiols.

The cured aryl (thio)ether aryl polysiloxane composition can, of course, be formed in absence of any device using the method of curing of the present invention by, for example: formation and curing of films; extrusion, or exudation of variously shaped articles; injection molding, and other mold based formation, of various shaped articles, (e.g., lenses, or films having patterned surfaces, such as light extraction films). When a device, such as a semiconductor device, is present during curing, it is necessary that a curing temperature be selected that does not damage the device. In such case, one or more semiconductor elements of the semiconductor device may be encapsulated to form an encapsulated semiconductor device by coating the semiconductor element with the curable aryl (thio)ether aryl silicon composition before or during the step of curing. Alternatively, the cured aryl (thio)ether aryl polysiloxane composition may be formed as, for example, a free-standing film and then applied to the device.

The cured aryl (thio)ether aryl polysiloxane composition of the present invention has many uses, including underfiller, protective coating agent, potting agent, or adhesive agent (e.g., die-bonding applications) for electric and electronic products, including semiconductors. There is no particular limit to the types of semiconductor that can be encapsulated. For example, light emitting diode (LED) devices can be encapsulated with the cured aryl polysiloxane of the present invention. The high light transmittance of the aryl (thio)ether aryl polysiloxane composition makes it particularly suitable for use as an underfiller, protective coating agent, potting agent, or adhesive agent in semiconductor elements used for optical applications. The aryl (thio)ether aryl silicone moeity can be of great utility in the field of contact and intraocular lenses. Maintaining the proper $T_g$ is a critical technical constraint of intraocular and contact lenses. But high transparency and refractive index is also desired. Thus the aryl (thio)ether aryl polysiloxane is useful for these applications due to it's high RI and low $T_g$. Low viscosity curable aryl (thio)aryl silicon compositions are useful for casting an molding lenses, including ophthalmic lenses, intraocular implants, contact lenses, and optical device lenses. Cured aryl (thio)ether aryl silicon compositions may also be used as high thermal conductivity heat transfer underfills for flip chip packaging.

The device of the present invention is characterized in that its semiconductor elements are coated with cured aryl (thio)ether aryl polysiloxane composition, or are coated with the curable aryl (thio)ether aryl silicon composition, and then cured in place. Such semiconductor elements are exemplified by semiconductor elements used in diodes, transistors, thyristors, solid-state image pickup elements, monolithic ICs and in hybrid ICs. In addition, such semiconductor devices are exemplified by diodes, light-emitting diodes (LEDs), transistors, thyristors, photocouplers, charge coupled devices (CCDs), monolithic integrated circuits (ICs), hybrid ICs, large and very large scale integrated circuits (LSIs, and VLSIs).

Experimental. Some embodiments of the invention will now be described in detail in the following Examples.

Molecular Weight Determination using Gel Permeation Chromatography (GPC). Gel Permeation Chromatography, otherwise known as size exclusion chromatography, actually separates the members of a distribution according to their hydrodynamic size in solution rather than their molar mass. The system is then calibrated with standards of known molecular weight and composition to correlate elution time with molecular weight. The techniques of GPC are discussed in detail in *Modern Size Exclusion Chromatography*, W. W. Yau, J. J Kirkland, D. D. Bly; Wiley-Interscience, 1979, and in *A Guide to Materials Characterization and Chemical Analysis*, J. P. Sibilia; VCH, 1988, p. 81-84.

For example, the molecular weight information for a low molecular weight sample (e.g., 10,000) may be determined as follows: The sample (an aqueous emulsion containing low molecular weight particles) is dissolved in THF at a concentration of approximately 0.1% weight sample per volume THF, and shaken for 6 hours, followed by filtration through a 0.45 μm PTFE (polytetrafluoroethylene) membrane filter. The analysis is performed by injecting 100 μl of the above solution onto 3 columns, connected in sequence and held at 40° C. The three columns are: one each of PL Gel 5 100, PL Gel 5 1,000, and PL Gel 5 10,000, all available from Polymer Labs, Amherst, Mass. The mobile phase used is THF flowing at 1 ml/min. Detection is via differential refractive index. The system was calibrated with narrow molecular weight polystyrene standards. Polystyrene-equivalent molecular weights for the sample are calculated via Mark-Houwink correction using K=14.1×10$^{-3}$ ml/g and a=0.70 for the polystyrene standards.

Nuclear magnetic resonance (NMR) method for determining ratio of silicon bonded vinyl groups to silicon bonded hydrogen atoms. NMR analysis, using a Bruker ADVANCE™ 500 NMR Spectrometer, provides the gram equivalent weights of silicon bonded hydrogen atoms and vinyl components for formulating. The integrated proton NMR signal of vinylic or hydridic protons a silicon containing compound is then compared to the integrated signals from a known quantity of a toluene standard by proton NMR. The quantity of vinyl or hydride protons can then be calculated on a weight basis.

X-ray fluorescence (XRF) method for determining platinum concentration in hydrosilation catalyst stock solutions. Hydrosilation catalyst stock solutions are prepared by dissolving a known amount of hydrosilation catalyst in a known amount of solvent (toluene or xylenes). Platinum concentrations are calculated by performing X-ray fluorescence (XRF) spectroscopy on hydrosilation catalyst stock solutions in toluene or xylenes. XRF measurements, using a Philips PW2404 Sequential Wavelength Dispersive XRF, are calibrated with known platinum standards. Calculated amounts (e.g., microliters delivered using a micropipette) of hydrosilation catalyst stock solution are first combined with an alkenyl silicon-based precursor and then with a hydrido silicon-based precursor to form a curable aryl (thio)ether aryl silicon composition. Hydrosilation catalyst stock solutions are prepared at multiple concentrations.

Materials. Most siloxane monomers and polymers were purchased from Gelest, Inc. Solvents and other chemicals were purchased from Aldrich or Fisher Scientific. Chemicals were used as received. The platinum concentration are calculated by doing x-ray fluorescence spectroscopy on the platinum stock solutions. Polymer molecular weights are determined by gel-permeation chromatography using polystyrene standards, and are therefore relative molecular weights.

Refractive Index determination. Refractive indices were determined for the silicon-base precursors formed in the following synthetic reaction using a Reichert Abbe Mark II Digital Refractometer.

Synthesis of (p-pheoxyphenyl)phenyldimethoxysilane. 1.29 Grams of magnesium powder were placed in a dry nitrogen purged flask. 100 mL of tetrahydrofuran (anhydrous) was added via syringe, followed by 12 g of p-bromodiphenylether. The mixture was sonicated to begin Grignard formation. The solution was stirred at room temperature for 1 hr, followed by 1 hr at reflux. The solution was cooled. In a separate flask, 10.03 g of methanol-free phenyltrimethoxysilane was added to 60 mL anhydrous THF. The Grignard reagent was slowly added via addition funnel, and the reaction mixture was heated at 70° C. for 16 hours. The reaction was worked up in toluene. Yield was 15.62 grams of liquid (p-phenoxyphenyl)phenyldimethoxysilane.

Synthesis of vinyl terminated poly(p-phenoxyphenyl)phenylsiloxane. 0.91 Grams of (p-phenoxyphenyl)phenyldimethoxysilane was combined with 55.9 mg of divinyltetramethyldisiloxane, 180 mg of water, 423 mg of THF, and 58.5 mg of 40% tetrabutylammonium hydroxide (TBAH). The reaction was refluxed for 135 minutes at 85° C. in an oil bath, followed by 3 hours at 105° C. The reaction was then left at 105° C. for 30 minutes but without a condensor to remove volatiles and water. Reaction was worked up with toluene. Aqueous HCl and water washes were done to remove the TBAH. The yield was 0.47 grams of a liquid polymer, as well as a solid which did not dissolve in toluene. The RI of the polymer was 1.606 as determined by Abbe refractometer.

Synthesis of vinyl terminated polyp-phenoxyphenyllphenylsiloxane-co-phenylmethylsiloxane. 0.97 Grams of p-phenoxyphenylphenyldimethoxysilane was combined with 130 mg of phenylmethyldimethoxysilane, 74.6 mg of divinyltetramethyldisiloxane, 169 mg of water, 550 mg of THF, and 77.8 mg of 40% tetrabutylammonium hydroxide (TBAH). The reaction was refluxed for 45 minutes at 85° C. in an oil bath, followed by 30 minutes at 95° C., followed by 2.5 hours at 105° C. The reaction was then left at 105° C. for 20 minutes and then 110° C. for 10 minutes but without a condensor to remove volatiles and water. All reaction temperatures are the temperature of the oil bath setting. Reaction was worked up with toluene. Aqueous HCl and water washes were done to remove the TBAH. The yield was 0.82 grams of a liquid polymer. The RI of the polymer was 1.595 as determined by Abbe refractometer.

Synthesis of vinyl terminated poly(p-phenoxyphenyllphenylsiloxane-co-diphenylsiloxane. 8.24 Grams of p-phenoxyphenylphenyldimethoxysilane was combined with 9.41 g of diphenyldimethoxysilane, 1.30 g of divinyltetramethyldisiloxane, 2.96 g of water, and 1.36 g of 40% tetrabutylammonium hydroxide (TBAH). The reaction was refluxed for 65 minutes at 80° C. in an oil bath. The reaction was then left at 98° C. for 2 hours and 45 minutes but without a condensor to remove volatiles and water. For an additional 15 min the reaction at 98° C. was swept with nitrogen, such that the reaction mixture was clear. An additional 0.85 grams of divinyltetramethyldisiloxane was added, and the reaction was refluxed for 30 minutes at 98° C. with a condenser. All reaction temperatures are the temperature of the oil bath setting. Reaction was worked up with toluene. Aqueous HCl and water washes were done to remove the TBAH. The yield after rotovaping was 14.18 grams of a clear liquid polymer.

We claim:

1. A method of making an encapsulated semiconductor device, comprising the steps of:
    A. providing a curable aryl (thio)ether aryl silicon composition comprising:
        at least one silicon-based precursor which is a liquid silicon aryl (thio)ether aryl polysiloxane; and
        at least one silicon-based precursor which is a multi-linkable precursor comprising two or more reactive groups capable of reacting with a complementary reactive group of the same or other multi-linkable precursor;
    wherein the refractive index of the curable composition is at least 1.50; and
    B. curing the curable aryl (thio)ether aryl silicon composition to form the cured aryl (thio)ether aryl polysiloxane composition;
    C. providing a semiconductor device comprising semiconductor elements; and
    D. forming a coating on at least one surface of at least one of the semiconductor elements by a technique comprising steps selected from:
        applying the curable aryl (thio)ether aryl silicon composition to the surface before or during the step (B) of curing;
        applying the cured aryl (thio)ether aryl polysiloxane composition to the surface; and
        combinations thereof.

2. The method of claim 1, wherein:
    a) the curable aryl (thio)ether aryl silicon composition further comprises a hydrosilation catalyst;
    b) the hydrosilation catalyst is a metal or metal compound comprising a Group VIII element selected from platinum, rhodium, palladium, and combinations thereof;
    c) at least one multi-linkable precursor is an alkenyl aryl (thio)ether aryl siloxane comprising at least two silicon bonded alkenyl groups;
    d) at least one multi-linkable precursor is a hydrido aryl (thio)ether aryl silicon compound comprising at least two silicon bonded hydrogen atoms; and
    e) the method comprises the further, optional, step (E) of purifying the cured aryl (thio)ether aryl polysiloxane composition by a technique comprising steps selected from: removing at least a portion of the hydrosilation catalyst; deactivating at least a portion of the hydrosilation catalyst; and combinations thereof.

3. The method of claim 1, wherein the silicon aryl (thio) ether aryl polysiloxane is an aryl (thio)ether aryl polysiloxane represented by the average compositional Formula I, $$(R^1{}_n SiO_{(4-n)/2})_a (O_{(4-p-r)/2} R^2{}_p SiZ_r SiR^3{}_q O_{(4-q-r)/2})_b \qquad (I),$$

wherein:
    for each $(R^1{}_n SiO_{(4-n)/2})$ unit:
        subscript n equals independently 0, 1, 2, or 3;
    for each $(O_{(4-p-r)/2} R^2{}_p SiZ_r SiR^3{}_q O_{(4-q-r)/2})$ unit:
        subscript p equals 0, 1, 2, or 3;
        subscript q equals 0, 1, 2, or 3;
        p+q=0 to [8-(2r+1)];
        subscript r=1, 2, or 3;
        Z is selected from —$CHR^4 CHR^5$—$X_{s-}$, arylene, substituted arylene, and combinations thereof, wherein:
            —$CHR^4 CHR^5$—$X_5$— is the silicon-bridging akylene moiety
            X is independently selected from methylene, phenyl, substituted phenyl, oxygen, and combinations thereof;
            subscript s=0 or 1; and
            $R^4$ and $R^5$ are independently selected from hydrogen atom, aryl (thio)ether aryl, and alkyl;
    $R^1$, $R^2$, and $R^3$ comprise a silicon-bonded organic group selected from alkenyl, hydrogen atom, aryl, alkyl, hydroxy, alkoxy, aryloxy, aryl (thio)ether aryl, other hydrocarbon radical, and combinations thereof;
    at least one of $R^1$, $R^2$, and $R^3$ comprises a silicon bonded aryl (thio)ether aryl group;
    subscripts a and b are selected to conform with the mole fraction of the $(R^1{}_n SiO_{(4-n)/2})$ unit and the $O_{(4-p-r)/2} R^2{}_p SiZ_r SiR^3{}_q O_{(4-q-r)/2})$ unit, respectively;
    $0 \leq a \leq 1$; $0 \leq b \leq 1$; and
    a+b=1.

4. The method of claim 3, wherein the cured aryl (thio) ether aryl polysiloxane composition further comprises a hydrosilation catalyst, wherein:
    0<a<1; 0<b <1; and
    the hydrosilation catalyst is a metal or metal compound comprising a Group VIII element selected from platinum, rhodium, palladium, and combinations thereof.

5. The method of claim 4, wherein the hydrosilation catalyst, and any derivatives thereof, is present in a combined amount of at least 0.005 ppm to less than 3.0 ppm, expressed as a Group VIII element equivalent value, based on the total weight of the cured aryl (thio)ether aryl polysiloxane composition.

6. The method of claim 3, wherein in the cured aryl polysiloxane, at least 70 mole percent to 100 mole percent of $R^1$, $R^2$, and $R^3$ combined are aryl (thio)ether aryl and, optionally, a silicon bonded organic group selected from vinyl, hydrogen atom, methyl, phenyl, naphthyl, and combinations thereof.

7. The method of claim 3, wherein in the cured aryl polysiloxane, at least 70 mole percent to 100 mole percent of $R^1$, $R^2$, and $R^3$ combined are phenoxyphenyls and, optionally, phenyl.

8. The method of claim 1, wherein the curable aryl (thio) ether aryl silicon composition is free of carrier solvent.

9. The method of claim 1, wherein the refractive index of the composition is at least 1.55.

10. The method of claim 1, wherein the refractive index of the composition is at least 1.58.

* * * * *